United States Patent
Adachi et al.

(10) Patent No.: US 12,010,917 B2
(45) Date of Patent: *Jun. 11, 2024

(54) THERMOELECTRIC CONVERSION MATERIAL, THERMOELECTRIC CONVERSION ELEMENT, THERMOELECTRIC CONVERSION MODULE, AND OPTICAL SENSOR

(71) Applicants: Sumitomo Electric Industries, Ltd., Osaka (JP); Toyota School Foundation, Nagoya (JP)

(72) Inventors: Masahiro Adachi, Osaka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 246 days.

This patent is subject to a terminal disclaimer.

(21) Appl. No.: 17/633,583

(22) PCT Filed: Jun. 25, 2020

(86) PCT No.: PCT/JP2020/024975
§ 371 (c)(1),
(2) Date: Feb. 8, 2022

(87) PCT Pub. No.: WO2021/039081
PCT Pub. Date: Mar. 4, 2021

(65) Prior Publication Data
US 2022/0310898 A1    Sep. 29, 2022

(30) Foreign Application Priority Data
Aug. 30, 2019    (JP) .................. 2019-158254

(51) Int. Cl.
H10N 10/852    (2023.01)
G01J 5/12    (2006.01)
H10N 10/17    (2023.01)

(52) U.S. Cl.
CPC .............. *H10N 10/852* (2023.02); *G01J 5/12* (2013.01); *H10N 10/17* (2023.02)

(58) Field of Classification Search
None
See application file for complete search history.

(56) References Cited

U.S. PATENT DOCUMENTS

2014/0352750 A1* 12/2014 Shin ...................... H10N 10/851
                                                                  136/200
2015/0311418 A1* 10/2015 Ballinger ............. H10N 10/852
                                                                  419/48

(Continued)

FOREIGN PATENT DOCUMENTS

JP    S63-102382 A    5/1988
JP    2015-079796 A    4/2015

(Continued)

OTHER PUBLICATIONS

Singh et al., "Improvement of Thermoelectric Properties of Ag2S by Se Substitution", Proceedings of the 80th JSAP Autumn Meeting, Sep. 18, 2019, 2 pages.

(Continued)

*Primary Examiner* — David P Porta
*Assistant Examiner* — Carolyn Fin
(74) *Attorney, Agent, or Firm* — XSENSUS LLP (57) ABSTRACT

A thermoelectric conversion material is represented by a composition formula $Ag_2S_{(1-x)}Se_x$. The value of x is not smaller than 0.2 and not greater than 0.95.

5 Claims, 6 Drawing Sheets

(56) References Cited

U.S. PATENT DOCUMENTS

| | | |
|---|---|---|
| 2016/0218267 A1 | 7/2016 | Ko et al. |
| 2016/0251992 A1 | 9/2016 | Kim et al. |
| 2016/0300994 A1* | 10/2016 | Adachi .................. H10N 10/01 |
| 2016/0343930 A1* | 11/2016 | Rhyee ..................... H10N 10/01 |
| 2017/0069812 A1 | 3/2017 | Toshima et al. |
| 2019/0214538 A1 | 7/2019 | Adachi et al. |
| 2019/0229252 A1* | 7/2019 | Leblanc .................. B22F 12/41 |
| 2022/0102607 A1* | 3/2022 | Lim ..................... H10N 10/857 |
| 2022/0278263 A1 | 9/2022 | Hirose et al. |

FOREIGN PATENT DOCUMENTS

| | | | | |
|---|---|---|---|---|
| JP | 2015-135939 A | | 7/2015 | |
| JP | 2015-170766 A | | 9/2015 | |
| JP | 2016-163039 A | | 9/2016 | |
| JP | 2016163039 A | * | 9/2016 | ............. F01N 5/025 |
| JP | 2017-500726 A | | 1/2017 | |
| WO | 2014/126211 A1 | | 8/2014 | |
| WO | 2018/043478 A1 | | 3/2018 | |

OTHER PUBLICATIONS

Ferhat et al., "Thermoelectric and Transport Properties of β-Ag2Se Compounds", Journal of Applied Physics, Jul. 15, 2000, vol. 88, No. 2, 5 pages.
Office Action issued on Dec. 21, 2023, in corresponding co-pending U.S. Appl. No. 17/631,495, 18 pages.

* cited by examiner

THERMOELECTRIC CONVERSION MATERIAL, THERMOELECTRIC CONVERSION ELEMENT, THERMOELECTRIC CONVERSION MODULE, AND OPTICAL SENSOR

CROSS-REFERENCE TO RELATED APPLICATIONS

The present application is based on PCT/JP2020/024975 filed on Jun. 25, 2020, and claims priority to Japanese Application No. 2019-158254, filed on Aug. 30, 2019, the entire contents of each are incorporated herein by reference.

TECHNICAL FIELD

The present disclosure relates to a thermoelectric conversion material, a thermoelectric conversion element, a thermoelectric conversion module, and an optical sensor.

BACKGROUND ART $Ag_2Se$ (silver selenide) used as a thermoelectric conversion material is known (e.g., Non Patent Literature 1).

CITATION LIST

Non Patent Literature

Non Patent Literature 1: Marhoun Ferhat et al., "Thermoelectric and transport properties of $\beta$-$Ag_2Se$ compounds", Journal of Applied Physics 88, 813 (2000)

SUMMARY OF INVENTION

A thermoelectric conversion material according to the present disclosure is represented by a composition formula $Ag_2S_{(1-x)}Se_x$. The value of x is not smaller than 0.2 and not greater than 0.95.

DESCRIPTION OF EMBODIMENTS

Problems to be Solved by the Present Disclosure

In thermoelectric conversion, heat is directly converted into electric power, so no extra waste is discharged during the conversion. A power generation device utilizing the thermoelectric conversion requires no motor or other drive unit, offering advantages such as easy maintenance of the device.

Efficiency η in converting a temperature difference (heat energy) into electric energy using a material (thermoelectric conversion material) for thermoelectric conversion is given by the following expression (1).

$$\eta=\Delta T/T_h \cdot (M-1)/(M+T_c/T_h) \tag{1}$$

Here, η represents a conversion efficiency, ΔT represents a difference between $T_h$ and $T_c$, $T_h$ represents a temperature on the high temperature side, $T_c$ represents a temperature on the low temperature side, M equals to $(1+ZT)^{1/2}$, $ZT=\alpha^2 ST/\kappa$, ZT represents a dimensionless figure of merit, α represents a Seebeck coefficient, S represents an electrical conductivity, T represents a temperature, and κ represents a thermal conductivity. The conversion efficiency is a monotonically increasing function of ZT. It is important to increase ZT in developing a thermoelectric conversion material. Further, from the standpoint of operating environment, it is desired that a high ZT can be achieved in a low temperature range.

Thus, one of the objects is to provide a thermoelectric conversion material, a thermoelectric conversion element, a thermoelectric conversion module, and an optical sensor which can realize a high ZT in a low temperature range.

Advantageous Effects of the Present Disclosure

According to the thermoelectric conversion material described above, a high ZT can be achieved in a low temperature range.

Description of Embodiments of the Present Disclosure

Firstly, embodiments of the present disclosure will be listed and described. A thermoelectric conversion material according to the present disclosure is represented by a composition formula $Ag_2S_{(1-x)}Se_x$. The value of x is not smaller than 0.2 and not greater than 0.95.

The present inventors conducted intensive studies to realize a high ZT in a low temperature range, and have found that with a material represented by a composition formula $Ag_2S_{(1-x)}Se_x$ where the value of x is not smaller than 0.2 and not greater than 0.95, the value of ZT becomes maximum in a low temperature range. That is, the thermoelectric conversion material represented by the composition formula $Ag_2S_{(1-x)}Se_x$ where x has a value of not smaller than 0.2 and not greater than 0.95 can realize a high ZT in a low temperature range, for example at a room temperature of about 25° C. As a result, high thermoelectric conversion efficiency can be achieved in the low temperature range.

In the thermoelectric conversion material described above, the value of x may be 0.5 or greater. With this, the maximum value of ZT can be made relatively large in a low temperature range. Accordingly, a higher thermoelectric conversion efficiency can be achieved.

A thermoelectric conversion element of the present disclosure includes: a thermoelectric conversion material portion; a first electrode disposed in contact with the thermoelectric conversion material portion; and a second electrode disposed in contact with the thermoelectric conversion material portion and apart from the first electrode. The thermoelectric conversion material portion is constituted by the above-described thermoelectric conversion material.

In the thermoelectric conversion element of the present disclosure, the material constituting the thermoelectric conversion material portion is the above-described thermoelectric conversion material. Therefore, a high ZT can be achieved in a low temperature range.

A thermoelectric conversion module of the present disclosure includes the above-described thermoelectric conversion element. According to the thermoelectric conversion module of the present disclosure, with the inclusion of the thermoelectric conversion element of the present disclosure capable of realizing a high ZT in a low temperature range, a thermoelectric conversion module that is able to realize a high ZT in a low temperature range can be obtained.

An optical sensor of the present disclosure includes: an absorber that absorbs optical energy; and a thermoelectric conversion material portion connected to the absorber. The thermoelectric conversion material portion is constituted by the above-described thermoelectric conversion material.

In the optical sensor of the present disclosure, the material constituting the thermoelectric conversion material portion is the above-described thermoelectric conversion material. Therefore, an optical sensor that has high sensitivity in a low temperature range can be provided.

Details of Embodiments of the Present Disclosure

Embodiments of the thermoelectric conversion material of the present disclosure will be described below with reference to the drawings. In the drawings referenced below, the same or corresponding parts are denoted by the same reference numerals and the descriptions thereof are not repeated.

Embodiment 1

A description will be made of a configuration of a thermoelectric conversion material according to Embodiment 1 of the present disclosure. The thermoelectric conversion material according to Embodiment 1 of the present disclosure is represented by a composition formula $Ag_2S_{(1-x)}Se_x$. The value of x is not smaller than 0.2 and not greater than 0.95.

The thermoelectric conversion material according to Embodiment 1 can be produced, for example, through the following producing method. Firstly, Ag powder, S powder, and Se powder are prepared. Here, when the thermoelectric conversion material is represented by the composition formula $Ag_2S_{(1-x)}Se_x$, the mixing ratios of S and Se are adjusted such that the value of x is not smaller than 0.2 and not greater than 0.95. The powders are mixed, pressed, and solidified into a pellet form, thereby obtaining a green compact. Next, a portion of the obtained green compact in the pellet form is heated for crystallization.

The heating of a portion of the green compact is performed within a chamber having a heater such as a resistance heating wire, for example. The chamber has a reduced pressure. Specifically, the degree of vacuum in the chamber is set to be about $1 \times 10^{-4}$ Pa, for example. The green compact is heated with the heater for about one second. When the crystallization start temperature is reached, a portion of the green compact is crystallized. The heating is stopped after the crystallization of the portion of the green compact. In this case, the crystallization is promoted by self-heating without the need of reheating. That is, the remaining portion of the green compact is crystallized by the self-heating of the green compact with the progress of crystallization. In this manner, the thermoelectric conversion material in Embodiment 1 is obtained. Examples of the specific composition of the thermoelectric conversion material include $Ag_2S_{0.4}Se_{0.6}$, with the value of x being 0.6. It should be noted that as the thermoelectric conversion material in the present embodiment, a thermoelectric conversion material of n type is obtained.

Figure 1:
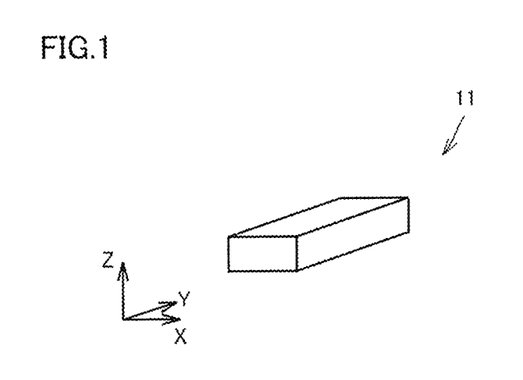
FIG. 1 is a schematic diagram showing the appearance of a thermoelectric conversion material in Embodiment 1.

FIG. 1 is a schematic diagram showing the appearance of a thermoelectric conversion material in Embodiment 1. Referring to FIG. 1, the thermoelectric conversion material 11 is, for example, a strip-shaped bulk body having a thickness.

Figure 2:
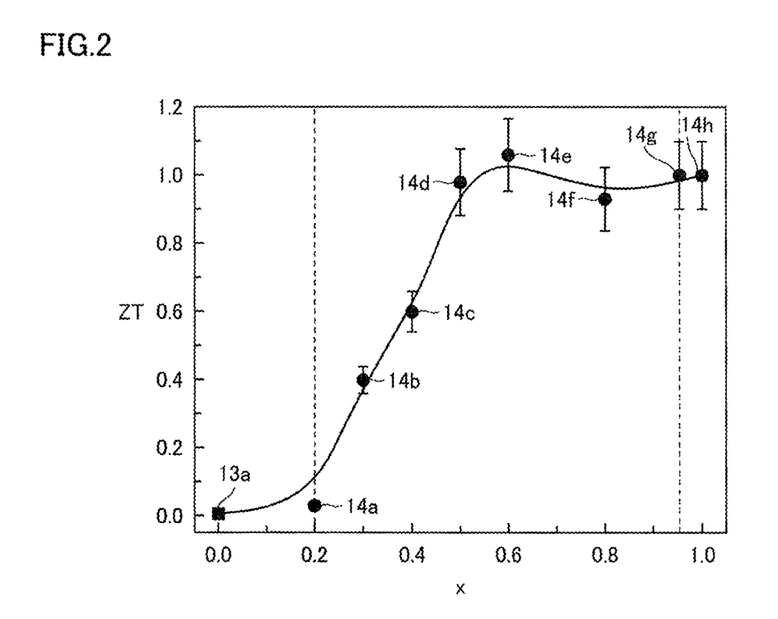
FIG. 2 is a graph showing a relationship between ZT and the value of x.

FIG. 2 is a graph showing a relationship between ZT and the value of x. In FIG. 2, the horizontal axis represents the value of x, i.e. the content ratio of Se, and the vertical axis represents the value of ZT. FIG. 2 shows the values of x from 0 to 1.0. A data item 13a is shown as a reference value. Data items 14a, 14b, 14c, 14d, 14e, 14f, 14g, and 14h each show a maximum value of ZT derived. The data item 13a indicates a value of ZT when the temperature is 177° C. The data item 14a indicates a value of ZT when the temperature is 122° C. The data item 14b indicates a value of ZT when the temperature is 92° C. The data item 14c indicates a value of ZT when the temperature is 87° C. The data item 14d indicates a value of ZT when the temperature is 77° C. The data item 14e indicates a value of ZT when the temperature is 67° C. The data item 14f indicates a value of ZT when the temperature is 87° C. The data item 14g indicates a value of ZT when the temperature is 122° C. The data item 14h indicates a value of ZT when the temperature is 131° C.

Figure 3:
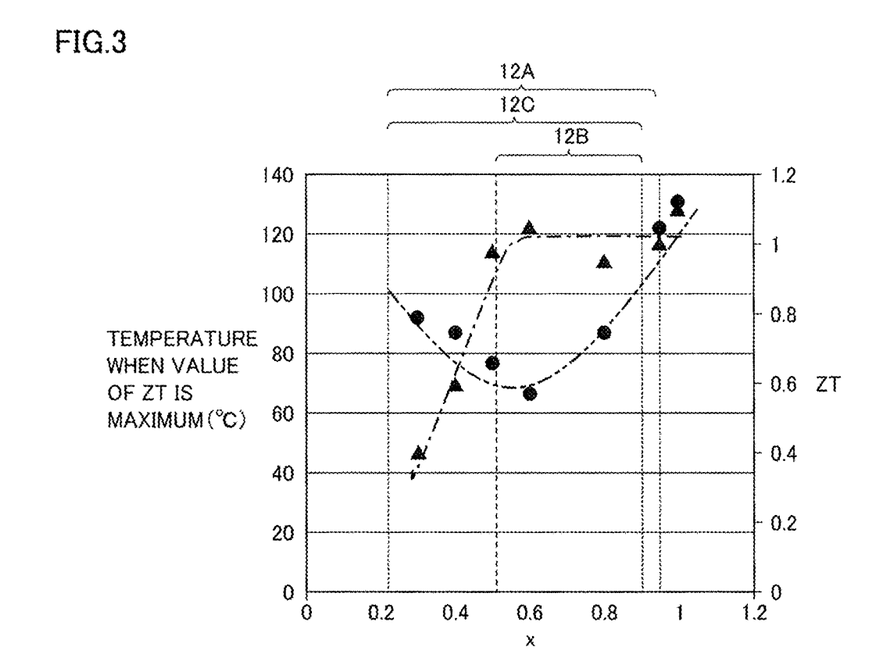
FIG. 3 is a graph showing a relationship between the temperature when the value of ZT is maximum and the value of x.

FIG. 3 is a graph showing a relationship between the temperature when the value of ZT is maximum and the value of x. FIG. 3 also shows a relationship between the maximum value of ZT and the value of x. In FIG. 3, the horizontal axis represents the value of x, i.e. the content ratio of Se, the left vertical axis represents temperature (° C.) when the value of ZT is maximum, and the right vertical axis represents the maximum value of ZT. In FIG. 3, each triangle indicates a maximum value of ZT, and each circle indicates a temperature when the value of ZT is maximum. In FIG. 3, the transition of the maximum value of ZT is indicated with the eye guide of dashed single-dotted line, and the transition of the temperature when the value of ZT is maximum is indicated with the eye guide of dashed double-dotted line.

Referring to FIGS. 2 and 3, the value of ZT increases as the value of x increases from 0. When the value of x becomes 0.2, the maximum value of ZT becomes greater than 0. The temperature at this time is 122° C. When the value of x is 0.3, the temperature at which ZT shows a maximum value is 92° C. When the value of x is 0.4, the temperature at which ZT shows a maximum value is 87° C. When the value of x is 0.5, the maximum value of ZT is about 1. The temperature when the value of x is 0.5 is 77° C. When the value of x becomes 0.6, the maximum value of ZT becomes greater than 1. The temperature when the value of x is 0.6 is 67° C. When the value of x is 0.8, the maximum value of ZT is about 1. The temperature when the value of x is 0.8 is 87° C. When the value of x is 0.95, the maximum value of ZT is greater than 1. The temperature when the value of x is 0.95 is 122° C.

Accordingly, the thermoelectric conversion material represented by the composition formula $Ag_2S_{(1-x)}Se_x$ and the value of x is not smaller than 0.2 and not greater than 0.95, as indicated with a region 12A in FIG. 3, can realize a high ZT in a low temperature range, for example at a room temperature of about 25° C. As a result, high thermoelectric conversion efficiency can be achieved in the low temperature range. In this regard, it is considered that the carrier concentration in the thermoelectric conversion material peaks at the temperature where ZT shows a maximum value.

Thermoelectric characteristics were measured using a thermoelectric characteristic measuring device (RZ2001i manufactured by Ozawa Science Co., Ltd.) The way of measuring the thermoelectric characteristics is as follows. Firstly, with a thermoelectric conversion material being fixed bridged between a pair of quartz fixtures, the atmosphere is heated using a resistive heating furnace. One of the quartz fixtures is made hollow to let nitrogen gas flow therein for cooling, thereby cooling one end portion of the thermoelectric conversion material. This gives a temperature difference to the thermoelectric conversion material. In the thermoelectric conversion material, a temperature difference between two points on a surface of the thermoelectric conversion material is measured using a platinum-platinum rhodium thermocouple (type R thermocouple). A voltmeter is connected to the thermocouple to measure a voltage generated due to the temperature difference between the two points. This makes it possible to measure the generated voltage with respect to the temperature difference, and on the basis of this to estimate a Seebeck coefficient of the material. A resistance value is measured in accordance with a four-terminal method. Specifically, two electric wires are connected on the outer side relative to two platinum wires to which the voltmeter is connected. Then, a current is passed through the electric wires and the amount of voltage drop is measured using the voltmeter located on the inner side. In this manner, the resistance value of the thermoelectric conversion material is measured in accordance with the four-terminal method. The resistivity is derived from the resistance value measured. It should be noted that the reciprocal of the resistivity thus derived is the electrical conductivity. Further, the thermal conductivity κ was measured using a laser flash method, using a measuring device (model number: LFA 457) manufactured by NETZSCH-Geraetebau GmbH. The Seebeck coefficient was calculated by plotting the measured temperature differences and the generated voltages on a graph and deriving the slope of the graph.

In the thermoelectric conversion material described above, the value of x may be 0.5 or greater. With this, the maximum value of ZT can be made relatively large in a low temperature range. Specifically, the value of x is set to be 0.5 or greater and 0.95 or smaller, as indicated with a region 12B in FIG. 3. This can reliably increase the value of ZT in the low temperature range. Accordingly, a higher thermoelectric conversion efficiency can be achieved.

As for the low temperature range, if the temperature at which ZT shows a maximum value is desired to be 100° C. or lower, the value of x may be set to be 0.2 or greater and 0.9 or smaller, as indicated with a region 12C in FIG. 3. This enables the value of ZT to be maximized when the thermoelectric conversion element using the thermoelectric conversion material is operated at 100° C. or lower.

Embodiment 2

A description will now be made of a power generation element as an embodiment of a thermoelectric conversion element using the thermoelectric conversion material according to the present disclosure.

Figure 4:
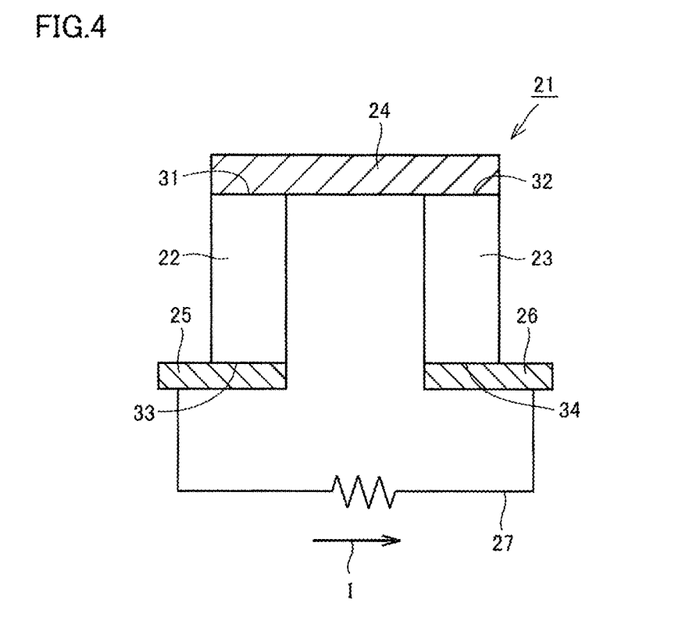
FIG. 4 is a schematic diagram showing the structure of a π type thermoelectric conversion element (power generation element), which is a thermoelectric conversion element.

FIG. 4 is a schematic diagram showing the structure of a π type thermoelectric conversion element (power generation element) 21, which is the thermoelectric conversion element in the present embodiment. Referring to FIG. 4, the π type thermoelectric conversion element 21 includes a p type thermoelectric conversion material portion 22 as a first thermoelectric conversion material portion, an n type thermoelectric conversion material portion 23 as a second thermoelectric conversion material portion, a high temperature side electrode 24, a first low temperature side electrode 25, a second low temperature side electrode 26, and a wire 27.

The p type thermoelectric conversion material portion 22 is constituted of a thermoelectric conversion material having p type conductivity. The thermoelectric conversion material constituting the n type thermoelectric conversion material portion 23 is the thermoelectric conversion material of Embodiment 1.

The p type thermoelectric conversion material portion 22 and the n type thermoelectric conversion material portion 23 are disposed side by side with a spacing therebetween. The high temperature side electrode 24 is disposed to extend from one end 31 of the p type thermoelectric conversion material portion 22 to one end 32 of the n type thermoelectric conversion material portion 23. The high temperature side electrode 24 is disposed so as to contact both the one end 31 of the p type thermoelectric conversion material portion 22 and the one end 32 of the n type thermoelectric conversion material portion 23. The high temperature side electrode 24 is disposed to connect the one end 31 of the p type thermoelectric conversion material portion 22 and the one end 32 of the n type thermoelectric conversion material portion 23. The high temperature side electrode 24 is composed of an electrically conductive material, such as a metal. The high temperature side electrode 24 is in ohmic contact with the p type thermoelectric conversion material portion 22 and the n type thermoelectric conversion material portion 23.

The first low temperature side electrode 25 is disposed in contact with another end 33 of the p type thermoelectric conversion material portion 22. The first low temperature side electrode 25 is disposed apart from the high temperature side electrode 24. The first low temperature side electrode 25 is composed of an electrically conductive material, such as a metal. The first low temperature side electrode 25 is in ohmic contact with the p type thermoelectric conversion material portion 22.

The second low temperature side electrode 26 is disposed in contact with another end 34 of the n type thermoelectric conversion material portion 23. The second low temperature side electrode 26 is disposed apart from the high temperature side electrode 24 and the first low temperature side electrode 25. The second low temperature side electrode 26 is composed of an electrically conductive material, such as a metal. The second low temperature side electrode 26 is in ohmic contact with the n type thermoelectric conversion material portion 23.

The wire 27 is composed of an electric conductor such as a metal. The wire 27 electrically connects the first low temperature side electrode 25 and the second low temperature side electrode 26.

In the π type thermoelectric conversion element 21, when a temperature difference is formed so that the one end 31 side of the p type thermoelectric conversion material portion 22 and the one end 32 side of the n type thermoelectric conversion material portion 23 are at a high temperature and the other end 33 side of the p type thermoelectric conversion material portion 22 and the other end 34 side of the n type thermoelectric conversion material portion 23 are at a low temperature, for example, then p type carriers (holes) move from the one end 31 side toward the other end 33 side in the p type thermoelectric conversion material portion 22. At this time, in the n type thermoelectric conversion material portion 23, n type carriers (electrons) move from the one end 32 side toward the other end 34 side. As a result, a current flows through the wire 27 in the direction of the arrow I. In this manner, power generation by thermoelectric conversion using a temperature difference is achieved in the π type thermoelectric conversion element 21. In other words, the π type thermoelectric conversion element 21 is a power generation element.

As the material constituting then type thermoelectric conversion material portion 23, the thermoelectric conversion material of Embodiment 1 capable of realizing a high ZT in a low temperature range, for example, is adopted. As a result, the π type thermoelectric conversion element 21 is a power generation element that is highly efficient in a low temperature range.

In the above embodiment, the π type thermoelectric conversion element has been described as an example of the thermoelectric conversion element of the present disclosure. However, the thermoelectric conversion element of the present disclosure is not limited thereto. The thermoelectric conversion element of the present disclosure may be a thermoelectric conversion element having another structure, such as an I type (unileg) thermoelectric conversion element, for example.

Embodiment 3

Figure 5:
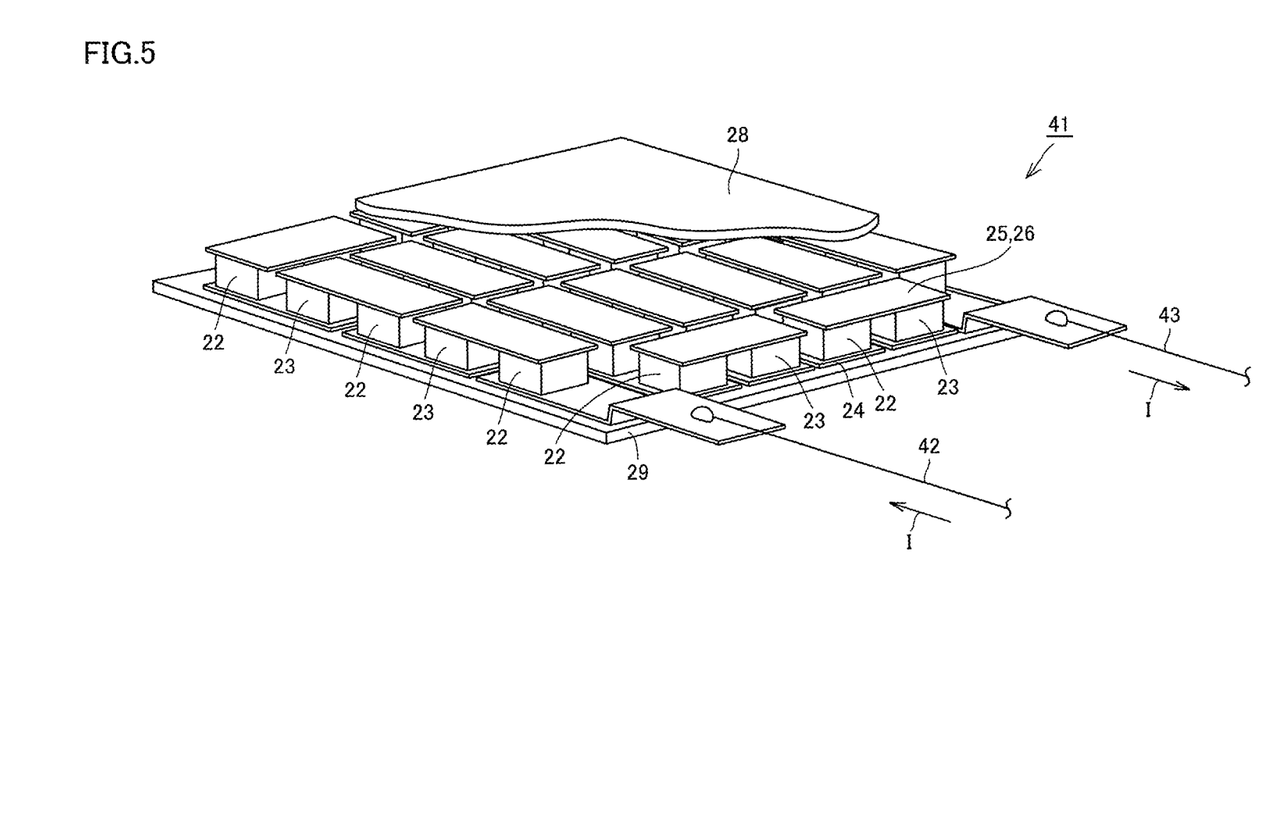
FIG. 5 shows an exemplary structure of a power generation module.

A plurality of π type thermoelectric conversion elements 21 can be electrically connected to obtain a power generation module as a thermoelectric conversion module. A power generation module 41, the thermoelectric conversion module of the present embodiment, has a structure of a plurality of π type thermoelectric conversion elements 21 connected in series.

FIG. 5 shows an exemplary structure of a power generation module. Referring to FIG. 5, the power generation module 41 of the present embodiment includes p type thermoelectric conversion material portions 22, n type thermoelectric conversion material portions 23, low temperature side electrodes 25, 26 each corresponding to the first and second low temperature side electrodes 25 and 26, high temperature side electrodes 24, a low temperature side insulator substrate 28, and a high temperature side insulator substrate 29. The low temperature side insulator substrate 28 and the high temperature side insulator substrate 29 are composed of a ceramic such as alumina. The p type thermoelectric conversion material portions 22 and the n type thermoelectric conversion material portions 23 are arranged alternately side by side. A low temperature side electrode 25, 26 is disposed in contact with a p type thermoelectric conversion material portion 22 and an n type thermoelectric conversion material portion 23, as in the above-described π type thermoelectric conversion element 21. A high temperature side electrode 24 is disposed in contact with a p type thermoelectric conversion material portion 22 and an n type thermoelectric conversion material portion 23, as in the above-described π type thermoelectric conversion element 21. A p type thermoelectric conversion material portion 22 is connected to an adjacent n type thermoelectric conversion material portion 23 on one side via a common high temperature side electrode 24. This p type thermoelectric conversion material portion 22 is also connected to an adjacent n type thermoelectric conversion material portion 23 on a side different from the above one side via a common low temperature side electrode 25, 26. In this manner, all the p type thermoelectric conversion material portions 22 and n type thermoelectric conversion material portions 23 are connected in series.

The low temperature side insulator substrate 28 is disposed on a main surface side of the plate-shaped low temperature side electrodes 25, 26 opposite to the side on which they contact the p type thermoelectric conversion material portions 22 and the n type thermoelectric conversion material portions 23. One low temperature side insulator substrate 28 is disposed for the plurality of (all the) low temperature side electrodes 25, 26. The high temperature side insulator substrate 29 is disposed on a side of the plate-shaped high temperature side electrodes 24 opposite to the side on which they contact the p type thermoelectric conversion material portions 22 and the n type thermoelectric conversion material portions 23. One high temperature side insulator substrate 29 is disposed for the plurality of (all the) high temperature side electrodes 24.

Wires 27 are connected to the high temperature side electrodes 24 or the low temperature side electrodes 25, 26 in contact with the p type thermoelectric conversion material portion 22 or the n type thermoelectric conversion material portion 23 located at respective ends of the series-connected p type thermoelectric conversion material portions 22 and n type thermoelectric conversion material portions 23. When a temperature difference is formed so that the high temperature side insulator substrate 29 side attains a high temperature and the low temperature side insulator substrate 28 side attains a low temperature, then the series-connected p type thermoelectric conversion material portions 22 and n type thermoelectric conversion material portions 23 permit a current to flow in the directions of the arrows I, as in the case of the π type thermoelectric conversion element 21 described above. In this manner, power generation by thermoelectric conversion using a temperature difference is achieved in the power generation module 41.

Embodiment 4

A description will now be made of an infrared sensor, which is an optical sensor, as another embodiment of the thermoelectric conversion element using the thermoelectric conversion material according to the present disclosure.

Figure 6:
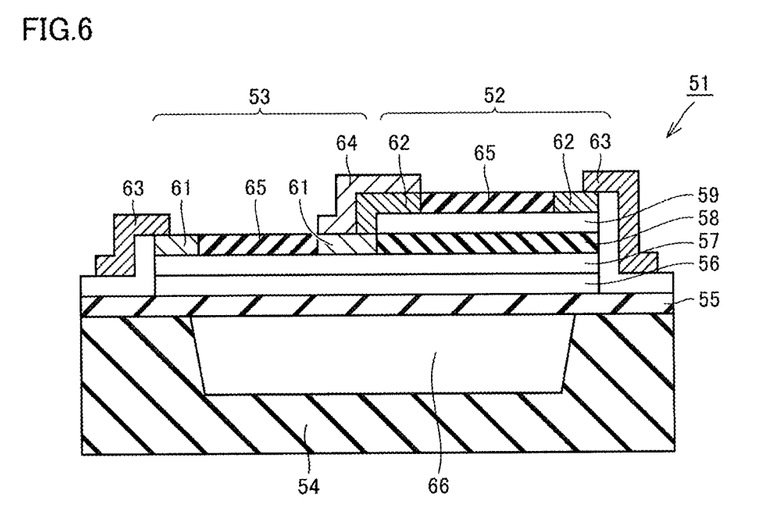
FIG. 6 shows an exemplary structure of an infrared sensor.

FIG. 6 shows an exemplary structure of an infrared sensor 51. Referring to FIG. 6, the infrared sensor 51 includes a p type thermoelectric conversion material portion 52 and an n type thermoelectric conversion material portion 53 disposed adjacent to each other. The p type thermoelectric conversion material portion 52 and the n type thermoelectric conversion material portion 53 are formed on a substrate 54.

The infrared sensor 51 includes the substrate 54, an etching stop layer 55, an n type thermoelectric conversion material layer 56, an $n^+$ type ohmic contact layer 57, an insulator layer 58, a p type thermoelectric conversion material layer 59, n side ohmic contact electrodes 61, p side ohmic contact electrodes 62, a heat absorption pad 63, an absorber 64, and a protective film 65.

The substrate 54 is composed of an insulator such as silicon dioxide. The substrate 54 has a recess 66 formed therein. The etching stop layer 55 is formed to cover a surface of the substrate 54. The etching stop layer 55 is composed of an insulator such as silicon nitride, for example. A gap is formed between the etching stop layer 55 and the recess 66 of the substrate 54.

The n type thermoelectric conversion material layer 56 is formed on a main surface of the etching stop layer 55 opposite to the substrate 54. The thermoelectric conversion material constituting the n type thermoelectric conversion material layer 56 is the thermoelectric conversion material of Embodiment 1. The $n^+$ type ohmic contact layer 57 is formed on a main surface of the n type thermoelectric conversion material layer 56 opposite to the etching stop layer 55. The n⁺ type ohmic contact layer 57 is doped with n type impurities that cause the generation of n type carriers (electrons) as majority carriers, for example, whereby the n⁺ type ohmic contact layer 57 has n type conductivity.

The n side ohmic contact electrode 61 is disposed to contact a central portion of a main surface of the n⁺ type ohmic contact layer 57 opposite to the n type thermoelectric conversion material layer 56. The n side ohmic contact electrode 61 is composed of a material that can make ohmic contact with the n⁺ type ohmic contact layer 57, such as a metal. The insulator layer 58, composed of an insulator such as silicon dioxide, for example, is disposed on the main surface of the n⁺ type ohmic contact layer 57 opposite to the n type thermoelectric conversion material layer 56. The insulator layer 58 is disposed on the main surface of the n⁺ type ohmic contact layer 57 on the p type thermoelectric conversion material portion 52 side with respect to the n side ohmic contact electrode 61.

The protective film 65 is also disposed on the main surface of the n⁺ type ohmic contact layer 57 opposite to the n type thermoelectric conversion material layer 56. The protective film 65 is disposed on the main surface of the n⁺ type ohmic contact layer 57 on the opposite side from the p type thermoelectric conversion material portion 52 side with respect to the n side ohmic contact electrode 61. On the main surface of the n⁺ type ohmic contact layer 57 opposite to the n type thermoelectric conversion material layer 56, another n side ohmic contact electrode 61 is disposed on the opposite side from the above-described n side ohmic contact electrode 61, with the protective film 65 sandwiched therebetween.

The p type thermoelectric conversion material layer 59 is disposed on a main surface of the insulator layer 58 opposite to the n⁺ type ohmic contact layer 57.

The protective film 65 is disposed at a central portion on a main surface of the p type thermoelectric conversion material layer 59 opposite to the insulator layer 58. On the main surface of the p type thermoelectric conversion material layer 59 opposite to the insulator layer 58, a pair of p side ohmic contact electrodes 62 are disposed sandwiching the protective film 65 therebetween. The p side ohmic contact electrodes 62 are composed of a material that can make ohmic contact with the p type thermoelectric conversion material layer 59, such as a metal. Of the pair of p side ohmic contact electrodes 62, the p side ohmic contact electrode 62 on the n type thermoelectric conversion material portion 53 side is connected to the n side ohmic contact electrode 61.

The absorber 64 is disposed to cover main surfaces of the mutually connected p side ohmic contact electrode 62 and n side ohmic contact electrode 61 opposite to the n⁺ type ohmic contact layer 57. The absorber 64 is composed of titanium, for example. The heat absorption pad 63 is disposed to be in contact with the top surface of the p side ohmic contact electrode 62 that is not connected to the n side ohmic contact electrode 61. The heat absorption pad 63 is also disposed to be in contact with the top surface of the n side ohmic contact electrode 61 that is not connected to the p side ohmic contact electrode 62. As a material constituting the heat absorption pad 63, gold (Au)/titanium (Ti), for example, is adopted. That is, the absorber 64 and the n type thermoelectric conversion material layer 56 are thermally connected to each other. The absorber 64 and the p type thermoelectric conversion material layer 59 are thermally connected to each other.

When the infrared sensor 51 is irradiated with infrared rays, the absorber 64 absorbs the energy of the infrared rays. As a result, the temperature of the absorber 64 rises. On the other hand, the temperature rise of the heat absorption pad 63 is suppressed. This forms a temperature difference between the absorber 64 and the heat absorption pad 63. Accordingly, in the p type thermoelectric conversion material layer 59, p type carriers (holes) move from the absorber 64 side toward the heat absorption pad 63 side. On the other hand, in the n type thermoelectric conversion material layer 56, n type carriers (electrons) move from the absorber 64 side toward the heat absorption pad 63 side. Then, by extracting a current generated as a result of the migration of the carriers from the n side ohmic contact electrodes 61 and the p side ohmic contact electrodes 62, the infrared rays are detected.

In the infrared sensor 51 of the present embodiment, the thermoelectric conversion material of Embodiment 1 is adopted as the thermoelectric conversion material constituting the n type thermoelectric conversion material layer 56. As a result, the infrared sensor 51 is an infrared sensor that is highly sensitive in a low temperature range.

It should be understood that the embodiments disclosed herein are illustrative and non-restrictive in every respect. The scope of the present disclosure is defined by the terms of the claims, rather than the description above, and is intended to include any modifications within the scope and meaning equivalent to the terms of the claims.

DESCRIPTION OF REFERENCE NUMERALS 11 thermoelectric conversion material
12A, 12B, 12C region
13a, 14a, 14b, 14c, 14d, 14e, 14f, 14g, 14h data item
21 π type thermoelectric conversion element
22, 52 p type thermoelectric conversion material portion
23, 53 n type thermoelectric conversion material portion
24 high temperature side electrode
25 first low temperature side electrode (low temperature side electrode)
26 second low temperature side electrode (low temperature side electrode)
27, 42, 43 wire
28 low temperature side insulator substrate
29 high temperature side insulator substrate
31, 32, 33, 34 end
41 thermoelectric conversion module
51 infrared sensor
54 substrate
55 etching stop layer
56 n type thermoelectric conversion material layer
57 n⁺ type ohmic contact layer
58 insulator layer
59 p type thermoelectric conversion material layer
61 n side ohmic contact electrode
62 p side ohmic contact electrode
63 heat absorption pad
64 absorber
65 protective film
66 recess
I arrow

The invention claimed is:
1. A thermoelectric conversion material represented by a composition formula $Ag_2S_{(1-x)}Se_x$,
x having a value of not smaller than 0.2 and not greater than 0.95.

2. The thermoelectric conversion material according to claim 1, wherein the value of x is not smaller than 0.5.

3. A thermoelectric conversion element comprising:
a thermoelectric conversion material portion;
a first electrode disposed in contact with the thermoelectric conversion material portion; and
a second electrode disposed in contact with the thermoelectric conversion material portion and apart from the first electrode;
the thermoelectric conversion material portion being constituted by the thermoelectric conversion material according to claim 1.

4. A thermoelectric conversion module comprising the thermoelectric conversion element according to claim 3.

5. An optical sensor comprising:
an absorber that absorbs optical energy; and
a thermoelectric conversion material portion connected to the absorber,
the thermoelectric conversion material portion being constituted by the thermoelectric conversion material according to claim 1.

* * * * *